(12) United States Patent
Makino et al.

(10) Patent No.: US 7,106,135 B2
(45) Date of Patent: Sep. 12, 2006

(54) AMPLIFIER SYSTEM AND METHOD

(75) Inventors: Jun Makino, Singapore (SG); Boon Ghee Ting, Singapore (SG)

(73) Assignee: Creative Technology Ltd, Singapore (SG)

( * ) Notice: Subject to any disclaimer, the term of this patent is extended or adjusted under 35 U.S.C. 154(b) by 49 days.

(21) Appl. No.: 10/927,351

(22) Filed: Aug. 26, 2004

(65) Prior Publication Data

US 2006/0044063 A1 Mar. 2, 2006

(51) Int. Cl.
*H03F 3/45* (2006.01)
*H03F 21/00* (2006.01)

(52) U.S. Cl. .................. 330/254; 330/251; 381/120

(58) Field of Classification Search ............... 330/254, 330/251, 207 A; 381/120, 121
See application file for complete search history.

(56) References Cited

U.S. PATENT DOCUMENTS

| 3,319,175 | A | 5/1967 | Dryden |
| 3,585,517 | A | 6/1971 | Herbert |
| 4,054,843 | A | 10/1977 | Hamada |
| 6,373,340 | B1 | 4/2002 | Shashoua |
| 6,396,933 | B1 | 5/2002 | Jung |
| 6,496,059 | B1 | 12/2002 | Nguyen |
| 6,696,891 | B1 * | 2/2004 | Noro et al. ............. 330/207 A |

* cited by examiner

*Primary Examiner*—Khanh Van Nguyen

(57) ABSTRACT

An amplifier system comprises an amplifier, a comparator connectable to the amplifier to compare an incoming signal with a number of reference potentials. A switching stage is controlled by the output of the comparator and arranged to select a voltage level to be applied to one side of a load, such as a loudspeaker system. A subtractor is included to subtract from the incoming signal a percentage of the selected voltage level to be applied to the load. The amplifier receives the output signal of the subtractor, amplifies that signal and applies it to a second side of the load. There is also disclosed a method for amplifying a signal.

13 Claims, 8 Drawing Sheets

Fig. 1 Conventional Amplifier, Typically Class B

AMPLIFIER SYSTEM AND METHOD

FIELD OF THE INVENTION

The present invention relates generally to an amplifier system and method for amplifying a signal, for use, for example in an audio amplifier circuit.

BACKGROUND OF THE INVENTION

Environmental considerations are becoming an increasingly important design parameter for product developments. For amplifier designs, considerable research has been directed towards high efficiency amplifiers which have less energy loss and various topologies exist that perform at a higher efficiency than conventional Class B amplifiers. Examples of such amplifiers are Class D, Class G and Class H amplifiers. Such amplifiers require smaller heat sinks than conventional Class B amplifiers, resulting in lighter and more compact products.

For a Class B amplifier having a fixed primary power supply, the theoretical maximum efficiency is 78.5% when it is driven to saturation by a sine wave, but in actual practice the efficiency does not exceed 70%.

The basic concept of conventional Class D amplifiers is to convert the input signal into a Pulse Width Modulated (PWM) signal and to recover the analog output signal through a low pass filter before delivering the signal to the load. A theoretical efficiency of 100% may be achievable with conventional Class D amplifiers and, in practice, over 90% efficiencies have been achieved using Class D Digital Amplifiers. Disadvantages of Class D amplifiers are the EMI issues which arise from the high level switching of the PWM signal. Furthermore, the typical requirement of the output low pass filter adds costs to the implementation of Class D amplifiers. At the same time, this output low pass filter also affects the output characteristics of the amplifier as a fixed load impedance of, for example, 6 ohms has to be assumed during its design.

This is not, however, the case for typical loudspeaker loads. In typical loudspeaker systems, when connected to a load which may range from 2 ohms to some tens of ohms for typical loudspeakers, the output characteristics will deviate from the target design.

Conventional Class G amplifiers generally achieve higher efficiencies than conventional Class B amplifiers by switching the power supply level at different fixed levels to have the power supply closer to the output signal. In theory, 100% efficiency may be achieved by increasing the number of fixed power supply levels indefinitely. However, as several devices have to be used to switch among the different supply voltages, this will create losses in practice.

Conventional Class H amplifiers use the input signal to control the power supply and vary the power supply by Pulse Width Modulation (PWM) to form an envelope over the output signal. Although a very high efficiency may be achieved in such amplifiers, such as theoretically up to 100%, the transient response of conventional Class H amplifiers may be poor and the bandwidth may be extremely limited due to the slow response of the power supply. Moreover, EMI issues will be a major concern in such amplifiers.

SUMMARY OF THE INVENTION

In general terms, the invention provides an amplifier system and method in which the voltage signal level in an amplifier is reduced by applying a voltage at various fixed levels to a first side of a load, obtaining a difference signal derived by subtracting a proportion of the voltage applied to the load from the input signal and applying the difference signal to the other side of the load through the amplifier. This results in the reconstruction of the signal across the load. The voltage swing obtainable across the load is greater than the output voltage swing obtainable from the amplifier alone, thus the efficiency of the amplifier system and power handling capacity of the system are improved.

According to a first aspect of the invention there is provided an amplifier system comprising:
an amplifier;
a comparator connectable to said amplifier to compare an incoming signal with a number of reference potentials, said comparator having an output;
a switching stage controllable by said output of said comparator to select a voltage level to be applied to one side of a load;
a subtractor for subtracting from said incoming signal a percentage of said selected voltage level to be applied to said load to provide an output signal of said subtractor;
said amplifier being arranged to receive said output signal of said subtractor and to amplify said output signal to be applied to a second side of said load.

According to a second aspect of the invention there is provided an audio system comprising the amplifier system defined above.

According to a third aspect of the invention there is provided a method for amplifying a signal in an amplifier system comprising:
comparing in a comparator an incoming signal with a number of reference potentials, said comparator having an output;
selecting in a switching stage a voltage level to be applied to one side of a load, said switching stage being controllable by said output of said comparator;
subtracting from said incoming signal a percentage of said selected voltage level to be applied to said load to provide an output signal of a subtractor;
receiving in an amplifier said output signal of said subtractor;
amplifying said output signal of said subtractor; and
applying said amplified signal to a second side of said load.

BRIEF DESCRIPTION OF THE DRAWINGS

Preferred features of the invention will now be described, for the sake of illustration only, with reference to the following Figures in which.

DESCRIPTION OF PREFERRED EMBODIMENTS

Figure 1:
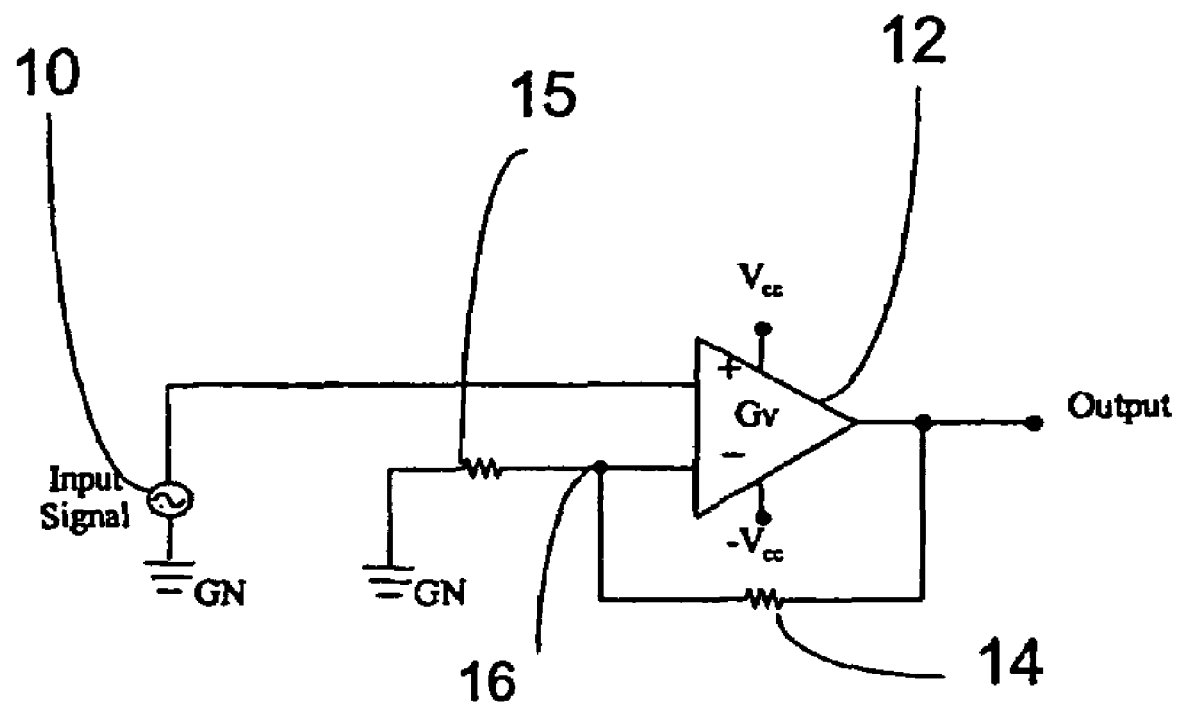
FIG. 1 is a schematic circuit diagram of a conventional Class B amplifier.

FIG. 1 shows a circuit diagram of a conventional Class B amplifier. An input signal 10 is applied between ground and the positive input terminal of an amplifier 12 which has a gain of Gv. Negative feedback is applied to the amplifier 12 by dividing the output signal therefrom in a potential divider comprising two resistors 14, 15 connected in series from the output of the amplifier 12 to ground. The junction 16 of the two resistors 14, 15 is connected to the negative terminal of the amplifier 12, the two resistors 14, 15 defining the gain of the amplifier 12. The amplifier 12 is powered by twin power supplies having power supply voltages which are fixed at $V_{cc}$ and $-V_{cc}$ respectively. Thus, the output signal from the amplifier 12 will vary within the range $-V_{cc}$ to $+V_{cc}$.

Assuming that there is no clipping, if the peak amplitude of the input signal 10 is $V_{ref}$, giving a corresponding peak output of $V_{cc}$, the gain of the amplifier 12 may be denoted by $$G_v = \frac{V_{cc}}{V_{ref}}.$$

The theoretical efficiency of such an amplifier 12 based on a sinusoidal input of amplitude $V_0$ may be denoted as $$\frac{\pi V_0}{4 V_{cc}}$$

and the power loss as $$\frac{2 V_{cc} V_0}{\pi R} - \frac{V_0}{2R},$$

where R is a resistive load.

Figure 2:
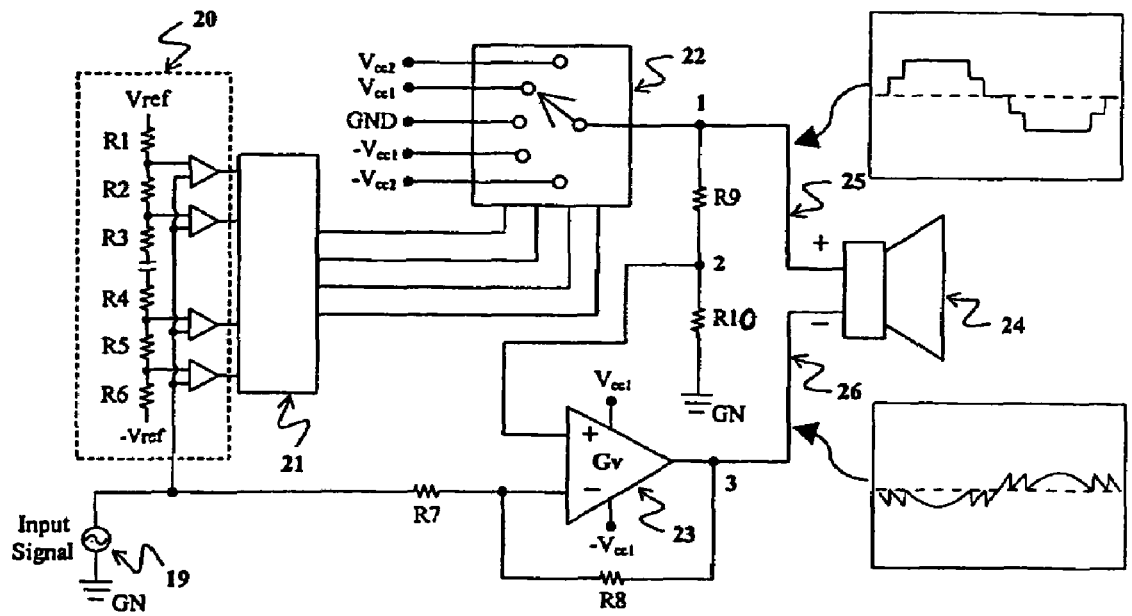
FIG. 2 is a schematic circuit diagram of an amplifier according to a preferred embodiment of the invention.

An amplifier circuit 18 according to a first preferred embodiment of the present invention is shown in FIG. 2. In this embodiment, the amplifier circuit 18 comprises an input signal 19, a comparator 20, a control circuit 21, a multi-way switch 22 and a differential amplifier 23. The input signal 19 is applied via a resistor R7 to the negative input of the differential amplifier 23. A resistor R8 is connected between the output of the differential amplifier 23 at node 3 and the negative input of the differential amplifier 23. The input signal 19 is also applied to the input of the comparator 20. The output terminals of the comparator 20 are connected to the multi-way switch 22 and the output of the multi-way switch is connected at a node 1 to the positive terminal of a loudspeaker 24 and also to a potential divider comprising two resistors R9 and R10 connected in series between node 1 and ground. The junction (node 2) of the resistors R9 and R10 is connected to the positive input of the differential amplifier 23.

The comparator 20 compares the input signal 19 with the reference voltages $-2/3 V_{ref}$, $-1/3 V_{ref}$, $+1/3 V_{ref}$ and $+2/3 V_{ref}$ which are fixed by resistors R1, R2, R3, R4, R5 and R6 within the comparator 20. Preferably,

R1=R2=R3=R4=R5=R6

$V_{cc1} = V_{cc}/3$ $V_{cc2} = 2 \times V_{cc1}$

R8/R7=Gv

R10/(R9+R10)=1/Gv

Also, $|V_{ref}|$ corresponds to the peak amplitude of the input signal 19.

When the amplitude of the input signal 19 is below $|V_{ref}/3|$, the ground potential is applied to node 1 at the positive terminal of the load 24. When the input signal 19 amplitude exceeds the reference voltages, a corresponding signal is sent to the control circuit 21 to indicate the level of the input signal 19. Via the multi-way switch 22, the control circuit 20 then switches on the appropriate DC voltage, at $-V_{cc2}$, $-V_{cc1}$, $V_{cc1}$ or $V_{cc2}$ respectively, to the positive terminal of the load 24, where $$|V_{cc1}| = \left|\frac{V_{cc}}{3}\right|, |V_{cc2}| = \left|\frac{2V_{cc}}{3}\right|$$

and $V_{cc}$ refers to the peak output voltage, which is also the power supply voltage of a conventional Class B amplifier delivering the same output power as the embodiment of the present invention illustrated in FIG. 2.

Figure 3:
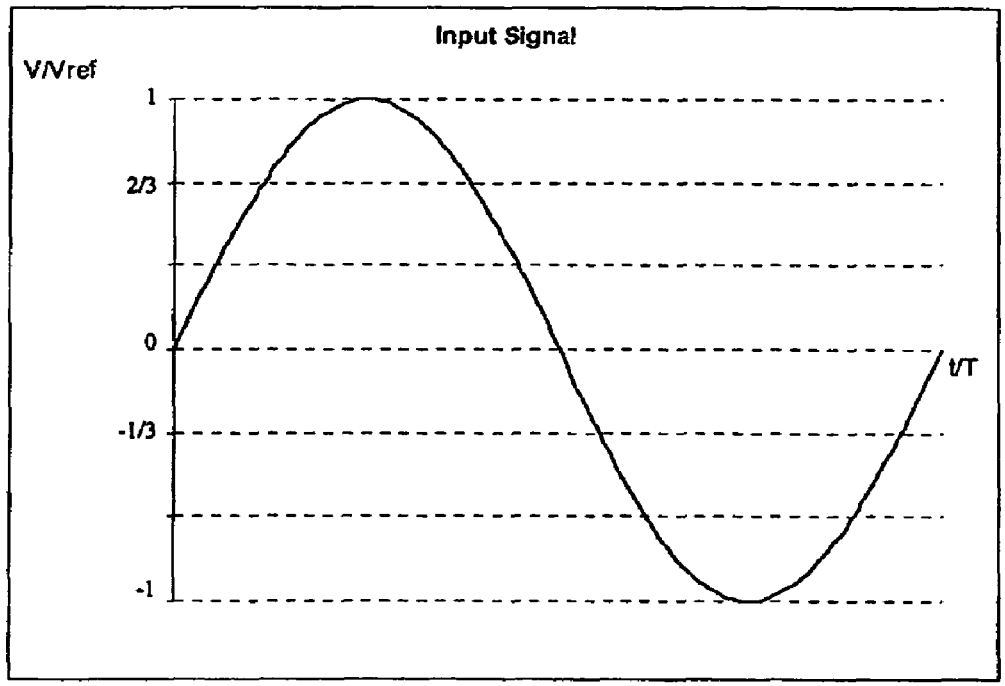
FIG. 3 is a waveform of an input signal in the form of a sine wave.

FIG. 3 shows an input waveform 19 comprising a sinusoidal waveform, the peak amplitude of which is equal to the maximum voltage present in the comparator 20.

Figure 4:
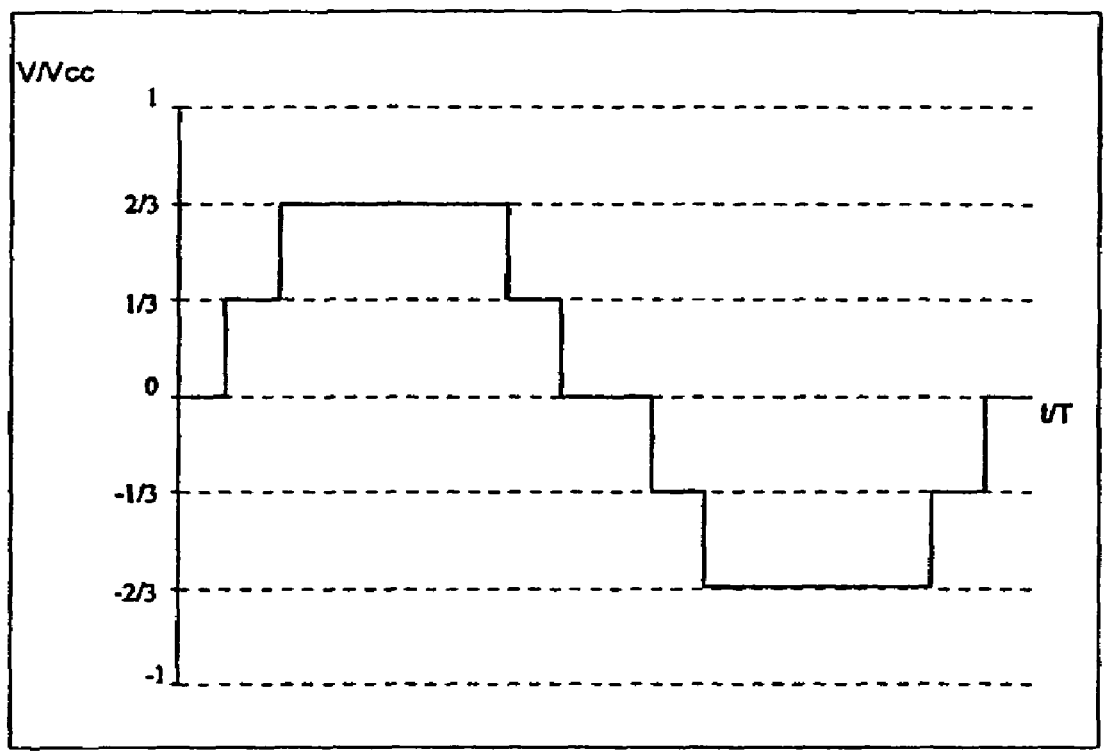
FIG. 4 is a waveform of a signal at node 1 in the circuit of FIG. 2 for a sine wave input signal of the type shown in FIG. 3.

When the waveform of FIG. 3, namely a sinusoidal input of amplitude $V_{ref}$ is applied to the comparator 20, a stepped waveform resembling the sinusoidal waveform will appear at the positive terminal of the load, as shown in FIG. 4.

The gain of the differential amplifier 23 is chosen such that $|Gv|=|V_{cc1}|/|V_{ref}|$ and its power supply voltages are $+V_{cc1}$ and $-V_{cc1}$. A proportion of the DC voltage applied to the load from node 2, the amplitude of which may be fixed by selecting appropriate values for the resistors R9 and R10, is fed to the positive input of the differential amplifier 23. This amplitude may be selected to be 1/Gv of the supplied DC voltage to the load. As the DC voltages are fixed at $-V_{cc2}$, $-V_{cc1}$, GND, Vcc1 and Vcc2, the signal to the positive input of the differential amplifier 23 will be correspondingly −2/3 Vref, −1/3 Vref, GND, +1/3 Vref and +2/3 Vref.

Figure 5:
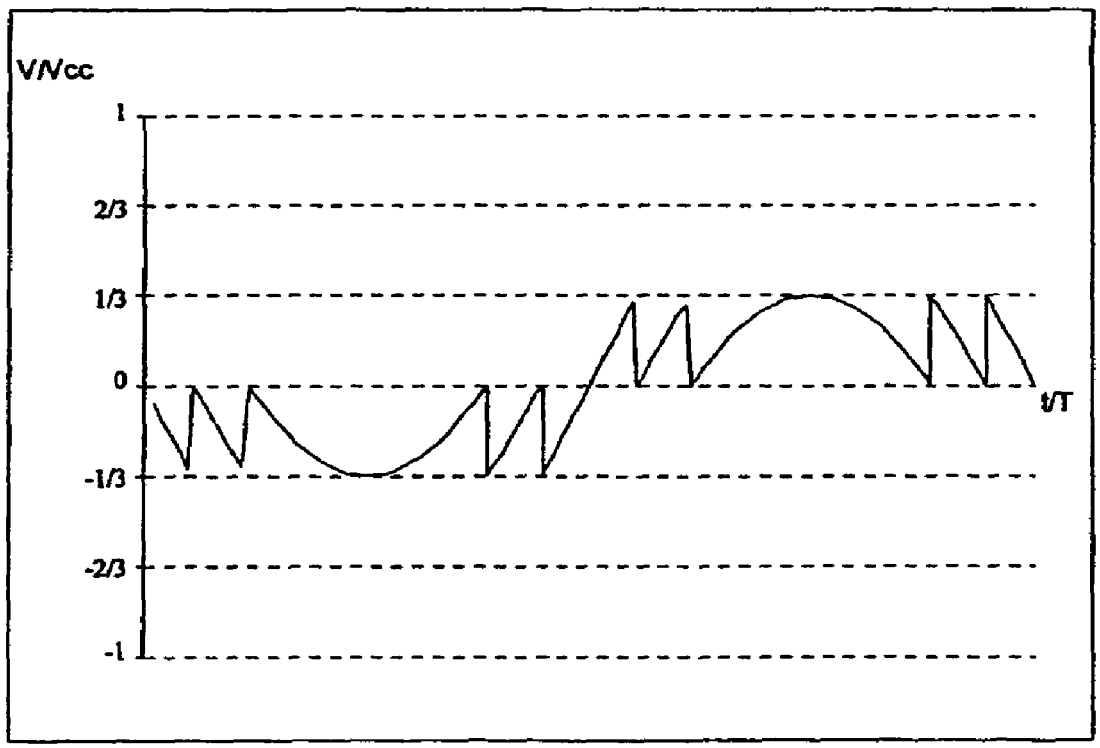
FIG. 5 is a waveform of a signal at node 3 in the circuit of FIG. 2 for a sine wave input signal of the type shown in FIG. 3.

The input signal 19 is fed to the negative input of the differential amplifier 23 through resistor R7. The difference between the positive input and the negative input of the differential amplifier 23 is amplified and fed to the negative terminal, Node 3, of the load, as shown in FIG. 5. That is, the differential amplifier acts as a subtractor to subtract the input signal 19 from the signal level presented at the positive input, and as an amplifier to amplify that difference and output it to the negative terminal of the load. The differential amplifier 23 essentially compensates for the difference between the signal fed to the positive terminal of the load and the desired signal. Thus, the overall signal as seen by the load will be equivalent to the input signal amplified by a gain of Gv.

On the positive side of the load 24, which is essentially switching among several DC voltage levels, the efficiency is theoretically 100%. On the negative side of the load, a conventional Class B amplifier design may be used for the differential amplifier 23. The efficiency of such a differential amplifier will be the same as a conventional Class B amplifier. However, since the supplied voltage is +$V_{cc}$/3 and −$V_{cc}$/3, the overall efficiency of the amplifier circuit of FIG. 2 as compared to a conventional Class B amplifier delivering the same output power, may be seen to be significantly higher. The efficiency and power loss calculations are described as follows.

Figure 6:
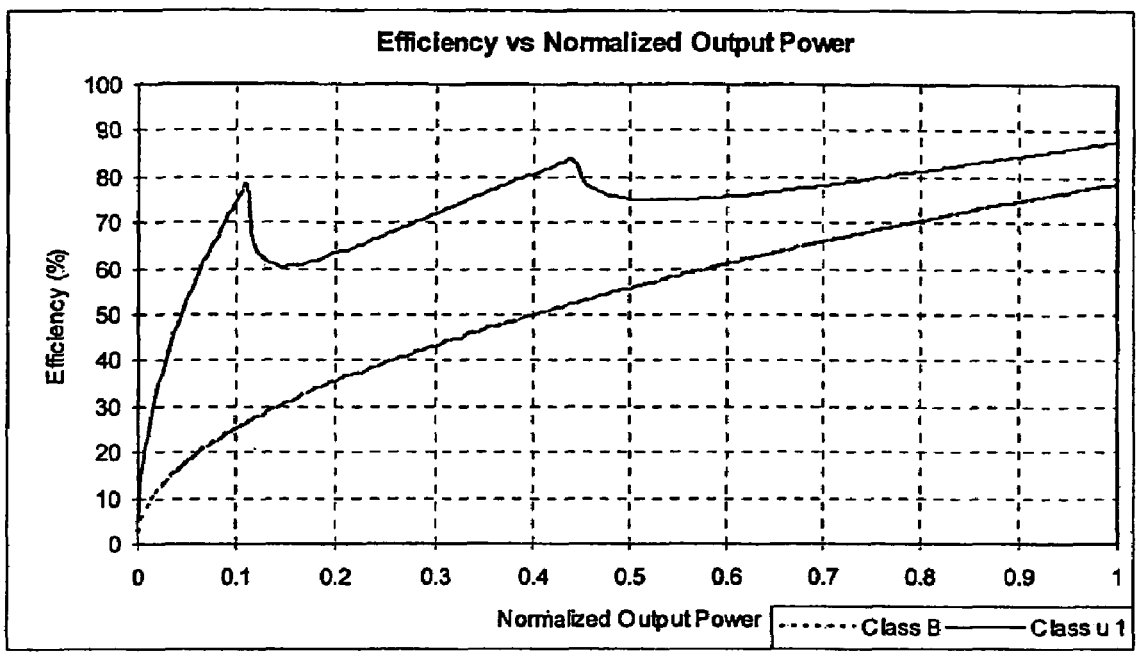
FIG. 6 is a graph of the efficiency against normalised power for the amplifier of FIG. 2 compared with a conventional Class B amplifier.

It is proposed that amplifiers embodying the present invention are to be named the Class μ Amplifier because of the resultant shape of the curve when the graph of Efficiency against Output Power is plotted (as shown in FIG. 6 described below).

SYMBOL DEFINITIONS

ε Efficiency
$\varepsilon_B$ Efficiency of normal (conventional) Class B Amplifier
$\varepsilon_1$ Efficiency of Stage 1 of Class μ Amplifier
$\varepsilon_2$ Efficiency of Stage 2 of Class μ Amplifier
$\varepsilon_3$ Efficiency of Stage 3 of Class μ Amplifier
f Frequency
I Current
$P_{in}$ Input power
$P_{out}$ Output power
$P_{total-in-2+}$ Total input power for positive side of Stage 2 of Class μ Amplifier
$P_{total-in-2-}$ Total input power for negative side of Stage 2 of Class μ Amplifier
$P_{total-in-3+}$ Total input power for positive side of Stage 3 of Class μ Amplifier
$P_{total-in-3-}$ Total input power for negative side of Stage 3 of Class μ Amplifier
$P_{ave-in}$ Average input power
$P_{ave-out}$ Average output power (same for both Class B and μ in this application)
$P_{ave-in-B}$ Average input power of normal Class B Amplifier
$P_{ave-in-1}$ Average input power of Stage 1 of Class μ Amplifier
$P_{ave-loss-1}$ Average power loss of Stage 1 of Class μ Amplifier
$P_{ave-in-2}$ Average input power of Stage 2 of Class μ Amplifier
$P_{ave-loss-2}$ Average power loss of Stage 2 of Class μ Amplifier
$P_{ave-in-3}$ Average input power of Stage 3 of Class μ Amplifier
$P_{ave-loss-3}$ Average power loss of Stage 3 of Class μ Amplifier
R Impedance, assumed resistive for this case
t time
$t_1$ Moment (or the time) that $V_{cc1}$ is switched on
$t_2$ Moment (or the time) that $V_{cc2}$ is switched on
T Period
$V_{out}$ Output voltage
$V_0$ Amplitude of output voltage ($=|V_{out}|$)
$V_{cc}$ Peak output voltage, which is also the supply voltage for a normal Class B Amplifier
$V_{cc1}$ First stage output voltage to positive side of load for Class μ Amplifier
$V_{cc2}$ Second stage output voltage to positive side of load for Class μ Amplifier
$V_{ref}$ Reference voltage, which corresponds to the peak input voltage to give the peak output voltage at $V_{cc}$
ω Angular frequency ($=2\pi f$)

In the calculations below, the positive side of the load 24 refers to the side with the DC voltage switching between −$V_{cc1}$, −$V_{cc2}$, GND, +$V_{cc1}$ and +$V_{cc2}$ and the negative side of the load 24 is connected to the differential amplifier 23 with a supply voltage of +$V_{cc1}$ and −$V_{cc1}$. The load R is taken to be resistive.

The following calculations are based on sinusoidal inputs.

Output voltage $\quad V_{out} = V_0 \sin\omega t$

Current, $\quad I = \dfrac{V_{out}}{R}$

Input power, $\quad P_{in} = V_{cc} I = \dfrac{V_{cc} V_{out}}{R}$

Output power, $\quad P_{out} = V_{out} I = \dfrac{V_{out}^2}{R}$

Average input power for 1 period, $\quad P_{ave-in} = \dfrac{1}{T} \int_0^T P_{in}\, dt$ Average output power for 1 period, $\quad P_{ave-out} = \dfrac{1}{T} \int_0^T P_{out}\, dt$ Efficiency, $\quad \varepsilon = \dfrac{P_{ave-out}}{P_{ave-in}}$ For both an amplifier of the type illustrated in FIG. 2 (hereinafter referred to as a Class μ amplifier) and a conventional Class B Amplifier:

$$\begin{aligned} \text{Average output power,} \quad P_{ave-out} &= \frac{1}{T}\int_0^T \frac{V_{out}^2}{R} dt \\ &= \frac{1}{TR}\int_0^T V_0^2 \sin^2\omega t\, dt \\ &= \frac{V_0^2}{TR}\int_0^T (1-\cos 2\omega t)\, dt \\ &= \frac{V_0^2}{2TR}\left[t - \frac{1}{2\omega}\sin 2\omega t\right]_0^T \\ &= \frac{V_0^2}{2TR}\left[t - \frac{1}{2\omega}\sin\frac{4\pi t}{T}\right]_0^T \\ &= \frac{V_0^2}{2R} \end{aligned}$$

For a conventional Class B Amplifier:

Average output power, (for 1/2 period, $T/2$)

$$P_{ave-out-B} = \frac{2}{T}\int_0^{\frac{T}{2}} \frac{V_{out}V_{cc}}{R} dt \qquad 5$$

$$= \frac{2V_{cc}}{TR}\int_0^{\frac{T}{2}} V_0 \sin\frac{2\pi t}{T} dt$$

$$= \frac{2V_{cc}V_0}{TR}\left(\frac{T}{2\pi}\right)\left[-\cos\frac{2\pi t}{T}\right]_0^{\frac{T}{2}}$$

$$= -\frac{2V_{cc}V_0}{2\pi R}\left[\cos\frac{\pi}{2} - 1\right]$$

$$= \frac{2V_{cc}V_0}{\pi R}$$

Average efficiency,
$$\varepsilon_B = \frac{P_{ave-out}}{P_{ave-in}}$$

$$= \frac{V_0^2}{2R} \times \frac{\pi R}{2V_{cc}V_0}$$

$$= \frac{\pi V_0}{4V_{cc}}$$

Average power loss, $P_{ave-loss-1} = P_{ave-in-1} - P_{ave-out}$ $$= \frac{2V_{cc}V_0}{\pi R} - \frac{V_0^2}{2R}$$

For a Class μ Amplifier—Stage 1: For sinusoidal output voltage $|V_0|<V_{cc1}$:

For this stage of operation, the ground potential will be supplied to the positive side of the load 24. Thus, only the differential amplifier 23 is supplying the signal to the load 24 at the negative side thereof.

Thus, average input power, 
$$P_{ave-in-1} = \frac{2V_{cc1}V_0}{\pi R}$$

$$= \frac{2V_{cc}V_0}{3\pi R} \quad \because V_{cc1} = \frac{V_{cc}}{3}$$

Efficiency,
$$\varepsilon_1 = \frac{\pi V_0}{4V_{cc1}}$$

$$= \frac{3\pi V_0}{4V_{cc}}$$

Comparing the above with a conventional Class B Amplifier, during this stage of operation, $$\frac{\varepsilon_1}{\varepsilon_B} = \frac{3\pi V_0}{4V_{cc}} \times \frac{4V_{cc}}{\pi V_0} = 3$$

$$\Rightarrow \varepsilon_1 = 3\varepsilon_B$$

Average power loss, $P_{ave-loss-1} = P_{ave-in-1} - P_{ave-out}$ $$= \frac{2V_{cc}V_0}{3\pi R} - \frac{V_0^2}{2R}$$

Class μ Amplifier Stage 2: For sinusoidal output voltage $|V_{cc1}|<|V_0|<|V_{cc2}|$:

For this stage, it is necessary to determine the time $t_1$, when $V_{out}=V_{cc1}$, which is the moment that $V_{cc1}$ is switched on.

Output voltage, $V_{out} = V_0 \sin\omega t$ (1)

At $t_1$, $V_{out} = V_{cc1}$, $\Rightarrow V_{cc1} = V_0 \sin\frac{2\pi}{T}t_1$ $$\frac{2\pi}{T}t_1 = \sin^{-1}\frac{V_{cc1}}{V_0}$$

$$t_1 = \frac{T}{2\pi}\sin^{-1}\frac{V_{cc}}{3V_0}$$

For positive side, total input power for ¼ period, $$P_{total-in-2+} = \int_{t_1}^{\frac{T}{4}} \frac{V_{cc1}V_0\sin\omega t}{R} dt$$

$$= \frac{V_{cc1}V_0}{R}\int_{t_1}^{\frac{T}{4}} \sin\frac{2\pi}{T}t\, dt$$

$$= \frac{V_{cc}V_0}{3R}\frac{T}{2\pi}\left[-\cos\frac{2\pi}{T}t\right]_{t_1}^{\frac{T}{4}}$$

$$= \frac{V_{cc}V_0 T}{6\pi R}\cos\frac{2\pi}{T}t_1$$

For the negative side, total input power for ¼ period, $$P_{total-in-2-} = \int_0^{\frac{T}{4}} \frac{V_{cc1}V_0\sin\omega t}{R} dt \qquad (2)$$

$$= \frac{V_{cc1}V_0}{R}\int_0^{\frac{T}{4}} \sin\frac{2\pi}{T}t\, dt$$

$$= \frac{V_{cc}V_0}{3R}\frac{T}{2\pi}\left[-\cos\frac{2\pi}{T}t\right]_0^{\frac{T}{4}}$$

$$= \frac{V_{cc}V_0 T}{6\pi R}$$

Average input power,
$$P_{ave-in-2} = \frac{P_{total-in-2+} + P_{total-in-2+}}{\frac{T}{4}}$$

$$= \frac{2V_{cc}V_0}{3\pi R}\left(1 + \cos\frac{2\pi}{T}t_1\right)$$

Efficiency,
$$\varepsilon_2 = \frac{V_0^2}{2R} \times \frac{3\pi R}{2V_{cc}V_0\left(1+\cos\frac{2\pi}{T}t_1\right)}$$

$$= \frac{3\pi V_0}{4V_{cc}\left(1+\cos\frac{2\pi}{T}t_1\right)}$$

Comparing the above with a conventional Class B Amplifier, $$\frac{\varepsilon_2}{\varepsilon_B} = \frac{3\pi V_0}{4V_{cc}\left(1+\cos\frac{2\pi}{T}t_1\right)} \times \frac{4V_{cc}}{\pi V_0}$$

$$\frac{\varepsilon_2}{\varepsilon_B} = \frac{3}{\left(1+\cos\frac{2\pi}{T}t_1\right)}$$

Average power loss, $P_{ave-loss-2} = P_{ave-in-2} - P_{ave-out}$ $$= \frac{2V_{cc}V_0}{3\pi R}\left(1+\cos\frac{2\pi}{T}t_1\right) - \frac{V_0^2}{2R}$$

Class μ Amplifier Stage 3: For sinusoidal output voltage $|V_{cc2}|<|V_0|<|V_{cc}|$:
From Equation (1) above, $$t_1 = \frac{T}{2\pi} \sin^{-1} \frac{V_{cc}}{3V_0}$$

At the time $t_2$, when $V_{out}=V_{cc2}$, the moment that $V_{cc2}$ is switched on, is given as follows:

$$V_{out} = V_0 \sin \omega t$$

$$\Rightarrow V_{cc2} = V_0 \sin \frac{2\pi}{T} t_2$$

$$\frac{2\pi}{T} t_2 = \sin^{-1} \frac{V_{cc2}}{V_0}$$

$$t_2 = \frac{T}{2\pi} \sin^{-1} \frac{2V_{cc}}{3V_0}$$

For the positive side of the load 24, the total input power for ¼ period may be denoted as follows:

$$P_{total-in-3+} = \int_{t_1}^{t_2} \frac{V_{cc1} V_0 \sin \omega t}{R} dt + \int_{t_2}^{\frac{T}{4}} \frac{V_{cc2} \sin \omega t}{R} dt$$

$$= \frac{V_{cc1} V_0}{R} \int_{t_1}^{t_2} \sin \frac{2\pi}{T} t\, dt + \frac{V_{cc2} V_0}{R} \int_{t_2}^{\frac{T}{4}} \sin \frac{2\pi}{T} t\, dt$$

$$= \frac{V_{cc1} V_0}{R} \frac{T}{2\pi} \left[-\cos \frac{2\pi}{T} t\right]_{t_1}^{t_2} + \frac{V_{cc2} V_0}{R} \frac{T}{2\pi} \left[-\cos \frac{2\pi}{T} t\right]_{t_2}^{\frac{T}{4}}$$

$$= \frac{V_0 T}{2\pi R} \left\{ V_{cc1} \left( \cos \frac{2\pi}{T} t_1 - \cos \frac{2\pi}{T} t_2 \right) + V_{cc2} \left( \cos \frac{2\pi}{T} t_2 \right) \right\}$$

But ∵ $V_{cc2} = 2V_{cc1}$, $$\therefore P_{total-in-3+} = \frac{V_0 T}{2\pi R} V_{cc1} \left( \cos \frac{2\pi}{T} t_1 + \cos \frac{2\pi}{T} t_2 \right)$$

$$= \frac{V_0 V_{cc} T}{6\pi R} \left( \cos \frac{2\pi}{T} t_1 + \cos \frac{2\pi}{T} t_2 \right)$$

For the negative side of the load 24, from equation (2), $$P_{total-in-3-} = \frac{V_{cc} V_0 T}{6\pi R}$$

Average total input power, $$P_{total-in-3} = \frac{P_{total-in-3+} + P_{total-in-3-}}{\frac{T}{4}}$$

$$= \frac{4}{T} \left\{ \frac{V_0 V_{cc} T}{6\pi R} \left[ \left( \cos \frac{2\pi}{T} t_1 + \cos \frac{2\pi}{T} t_2 \right) \right] + \frac{V_{cc} V_0 T}{6\pi R} \right\}$$

$$= \frac{2 V_0 V_{cc}}{3\pi R} \left( 1 + \cos \frac{2\pi}{T} t_1 + \cos \frac{2\pi}{T} t_2 \right)$$

Efficiency, $$\varepsilon_3 = \frac{V_0^2}{2R} \times \frac{3\pi R}{2 V_{cc} V_0 \left( 1 + \cos \frac{2\pi}{T} t_1 + \cos \frac{2\pi}{T} t_2 \right)}$$

$$= \frac{3\pi V_0}{4 V_{cc} \left( 1 + \cos \frac{2\pi}{T} t_1 + \cos \frac{2\pi}{T} t_2 \right)}$$

Comparing the above with a conventional Class B Amplifier, $$\frac{\varepsilon_3}{\varepsilon_B} = \frac{3\pi V_0}{4 V_{cc} \left( 1 + \cos \frac{2\pi}{T} t_1 + \cos \frac{2\pi}{T} t_2 \right)} \times \frac{4 V_{cc}}{\pi V_0}$$

$$\frac{\varepsilon_2}{\varepsilon_B} = \frac{3}{\left( 1 + \cos \frac{2\pi}{T} t_1 + \cos \frac{2\pi}{T} t_2 \right)}$$

Average power loss, $$P_{ave-loss-3} = P_{ave-in-3} - P_{ave-out}$$

$$= \frac{2 V_{cc} V_0}{3\pi R} \left( 1 + \cos \frac{2\pi}{T} t_1 + \cos \frac{2\pi}{T} t_2 \right) - \frac{V_0^2}{2R}$$

FIG. 6 shows a graph of Efficiency against Normalized Output Power for the amplifier circuit of FIG. 2, and, for comparison, a graph of Efficiency against Normalized Output Power for a conventional Class B amplifier. The graphs shown are for amplifiers operating at maximum output power with a sinusoidal input, without clipping, normalized to 1.

Figure 7:
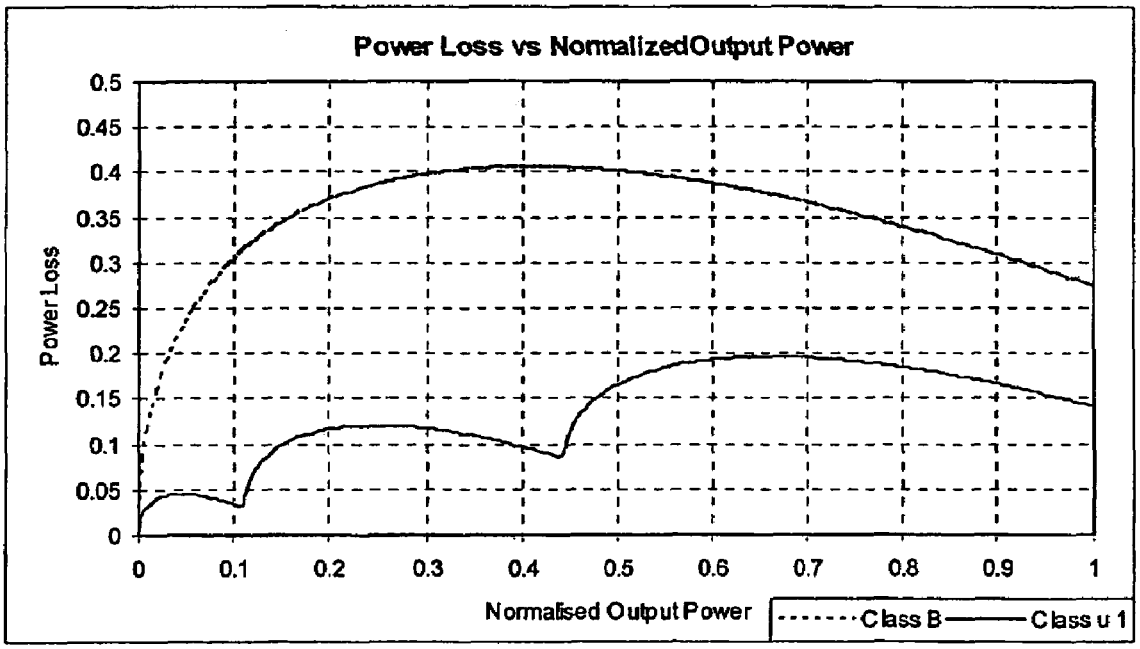
FIG. 7 is a graph of power loss against normalised output power for the amplifier of FIG. 2 compared with a conventional Class B amplifier.

FIG. 7 shows a graph of Power Loss in the amplifier of FIG. 2 against Normalized Output Power and, for comparison, a graph of Power Loss in a conventional Class B amplifier against Normalized Output Power. As with FIG. 6, the graphs shown are for amplifiers operating at maximum output power with a sinusoidal input, without clipping, normalized to 1.

Figure 8:
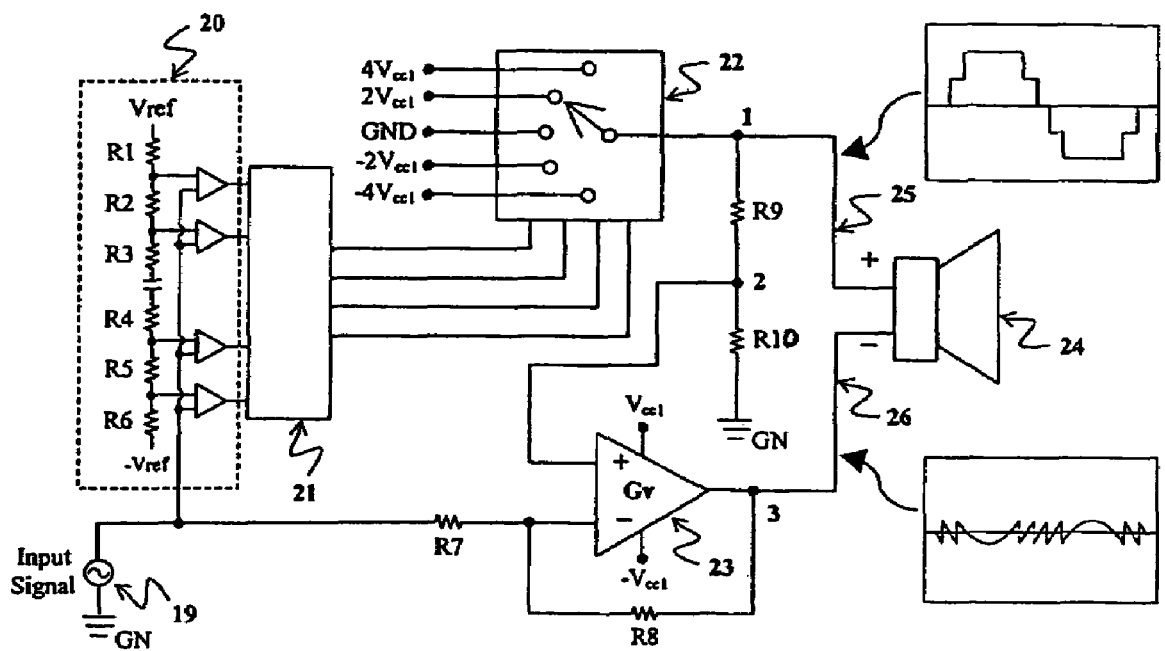
FIG. 8 is a schematic circuit diagram according to a further preferred embodiment of the invention.

FIG. 8 shows an alternative preferred embodiment of a Class μ Amplifier according to the present invention. The same reference numerals as those used in respect of the embodiment of FIG. 2 have been used to denote identical components.

The circuit shown in FIG. 8 is identical to that shown in FIG. 2, the difference being that $V_{cc1}$, which is the voltage step between inputs on the switching unit 22, is $V_{cc}/5$ in the circuit of FIG. 8 and the DC voltages output to the positive terminal at node 1 of the load 24 will therefore be $-4V_{cc1}$, $-2V_{cc1}$, GND, $2V_{cc1}$ and $4V_{cc1}$ accordingly.

The resistor values in the circuit of FIG. 8 are chosen as follows:

$$R_3/(R_1+R_2+R_3)=R_4/(R_4+R_5+R_6)=1/5$$

$$(R_2+R_3)/(R_1+R_2+R_3)=(R_4+R_5)/(R_4+R_5+R_6)=3/5$$

$$V_{cc1}=V_{cc}/5$$

$$R8/R7=G_V$$

$$R10/(R9+R10)=1/G_V$$

Figure 9:
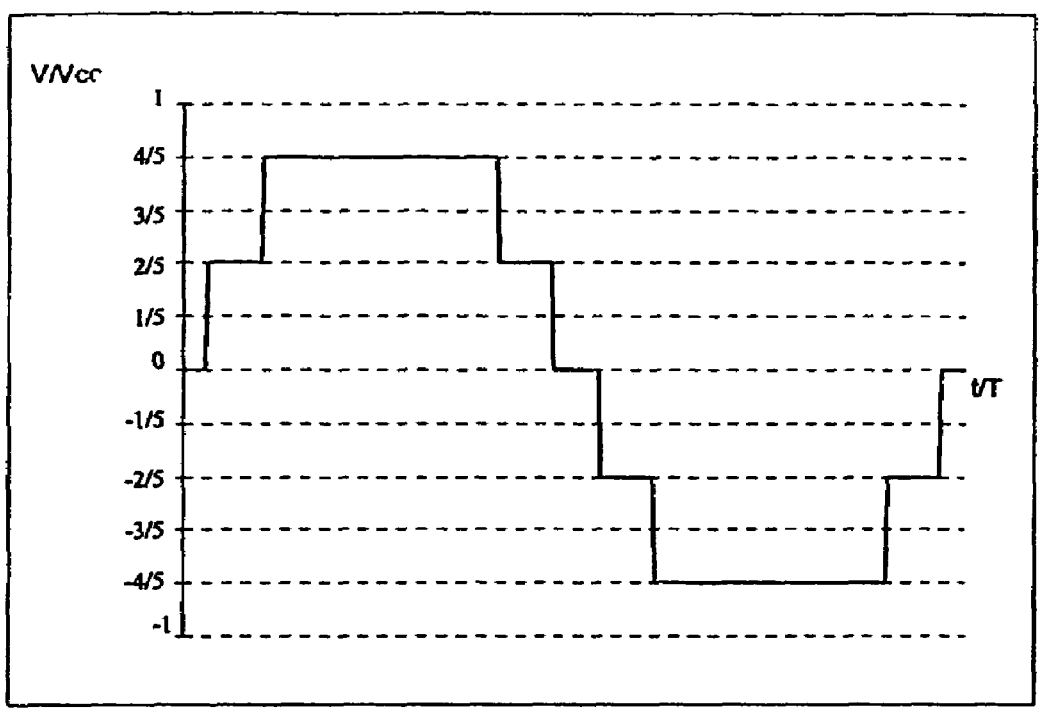
FIG. 9 is a waveform of a signal at node 1 in the circuit of FIG. 8 for a sine wave input signal.

FIG. 9 shows the waveform at the positive terminal (node 1) of the load 24 of the circuit of FIG. 8.

Figure 10:
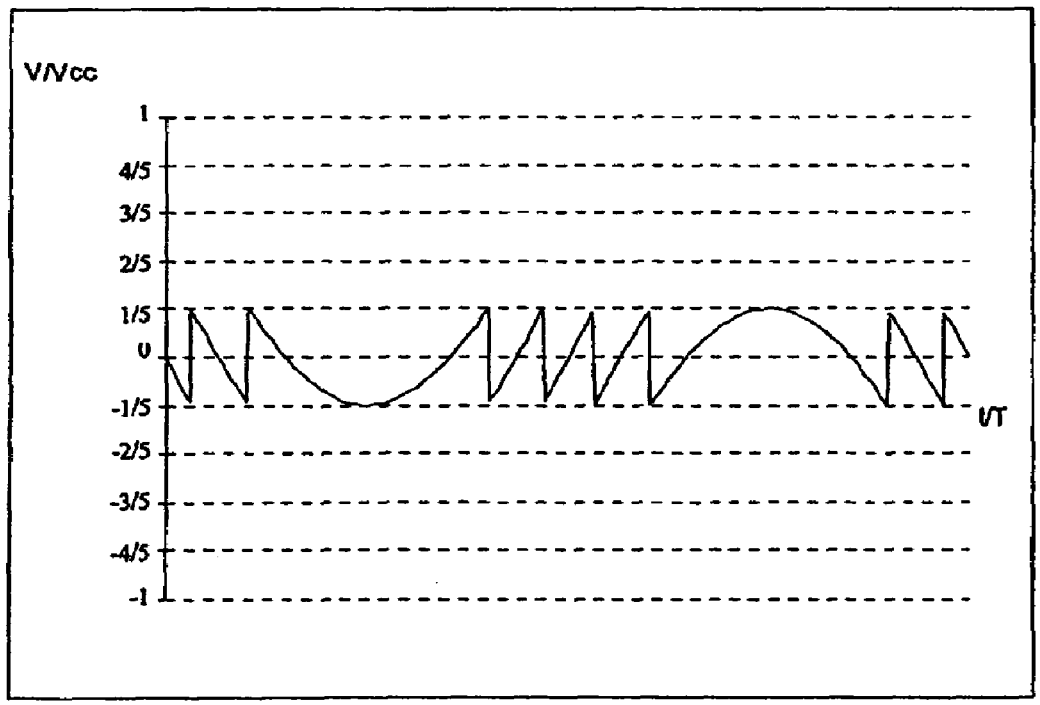
FIG. 10 is a waveform of a signal at node 3 in the circuit of FIG. 8 for a sine wave input signal.

FIG. 10 shows the signal at node 3 of the negative terminal of the circuit of FIG. 8.

In the embodiment of FIG. 8, on the negative side of the load 24, the differential amplifier, instead of giving a half swing (as shown in FIG. 5), gives a full swing as shown in FIG. 10.

Figure 11:
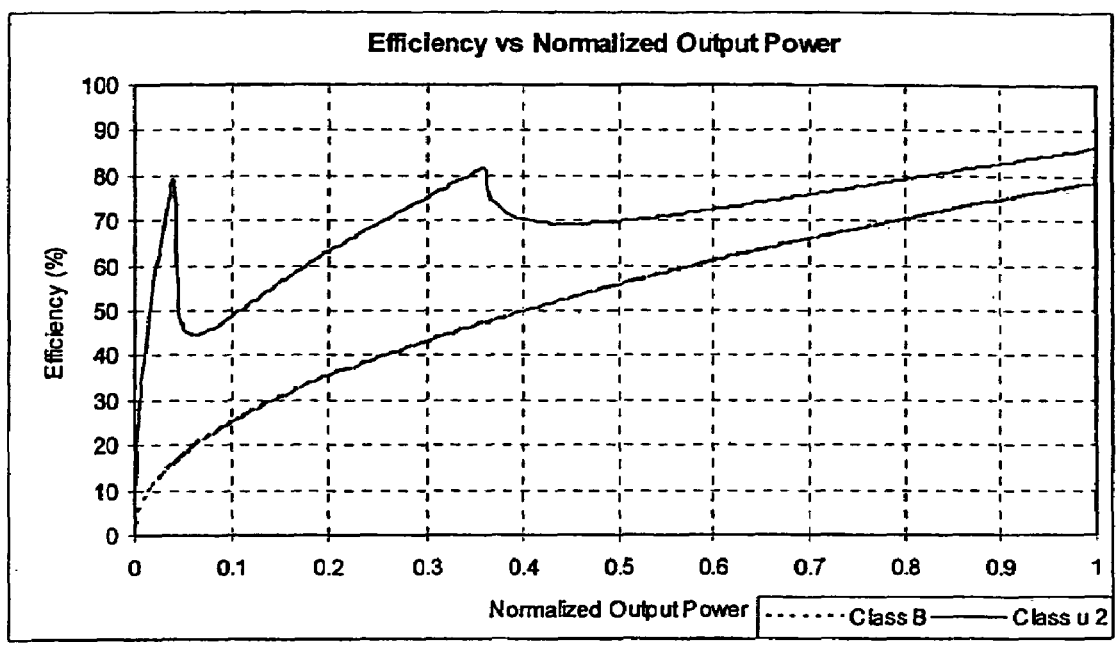
FIG. 11 is a graph of the efficiency against normalised power for the amplifier of FIG. 8 compared with a conventional Class B amplifier.

FIG. 11 shows a graph of Efficiency against Normalized Output Power for the amplifier of FIG. 8, and, for comparison, a graph of Efficiency against Normalized Output Power for a conventional Class B amplifier. The graphs shown are for the amplifiers operating at maximum output power with a sinusoidal input, without clipping normalized to 1.

Figure 12:
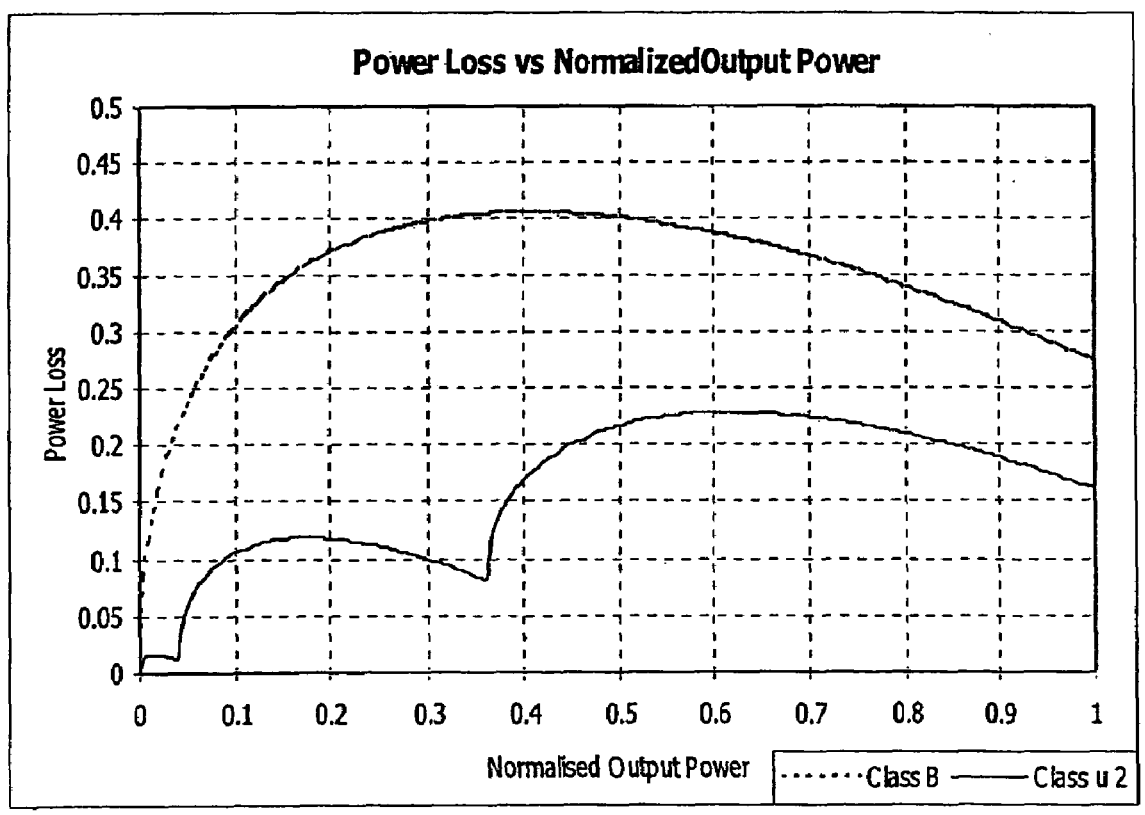
FIG. 12 is a graph of power loss against normalised output power for the amplifier of FIG. 8 compared with a conventional Class B amplifier.

FIG. 12 shows a graph Power Loss in the amplifier of FIG. 8 against Normalized Output Power and, for comparison, a graph of Power Loss in a conventional Class B amplifier against Normalized Output Power. As with FIG. 11, the graphs shown are for amplifiers operating at maximum output power with a sinusoidal input, without clipping normalized to 1.

Figure 13:
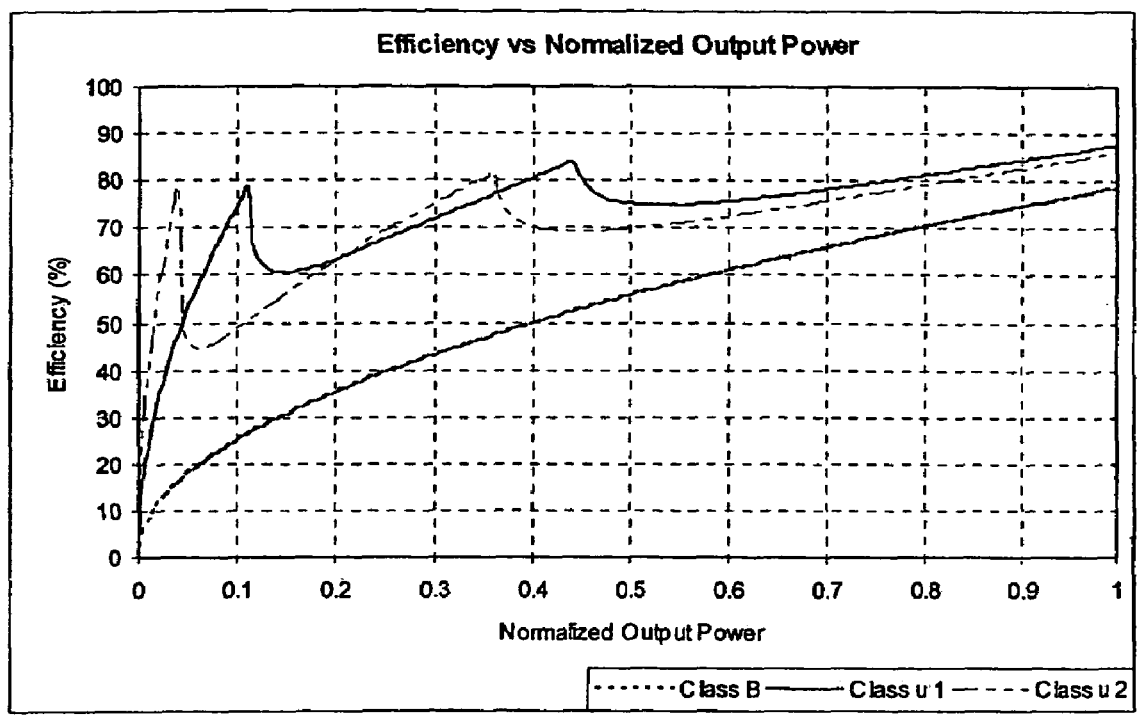
FIG. 13 is a graph of the efficiency against normalised power for the amplifiers of FIGS. 2 and 8 compared with a conventional Class B amplifier.

FIG. 13 shows a graph of Efficiency against Normalized Output Power for each of the amplifiers of FIGS. 2 and 8 and, for comparison, a graph of Efficiency against Normalized Output Power for a conventional Class B amplifier. The graphs shown are for amplifiers operating at maximum output power with a sinusoidal input, without clipping normalized to 1.

Figure 14:
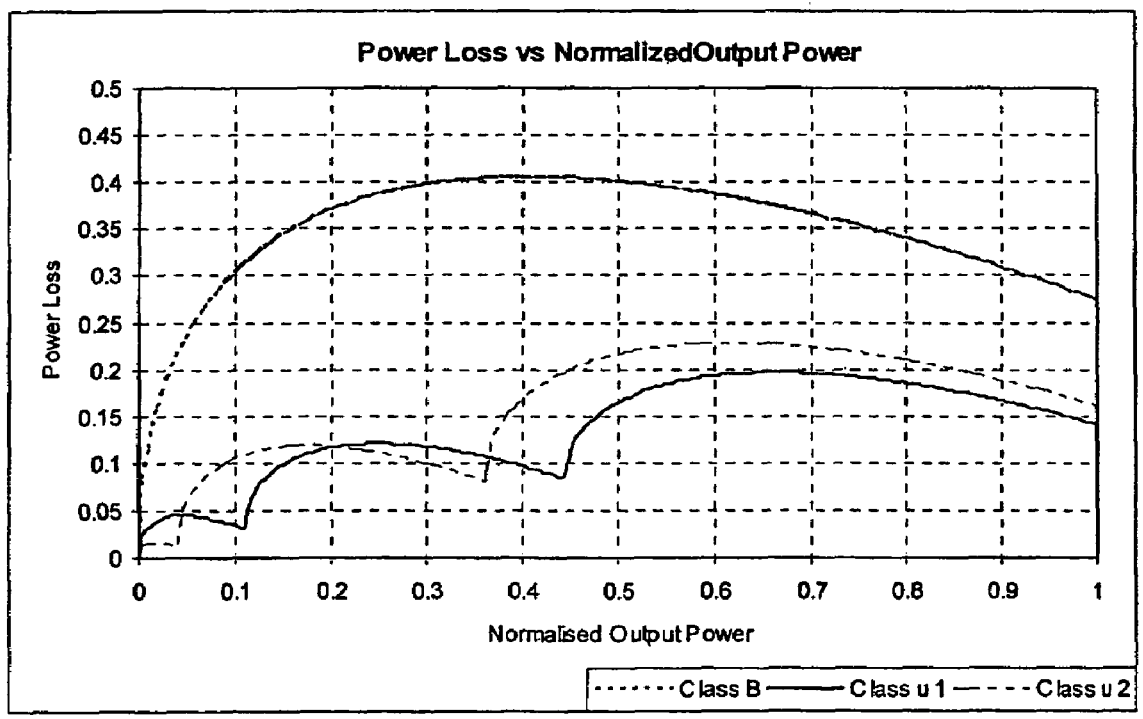
FIG. 14 is a graph of power loss against normalised output power for the amplifiers of FIGS. 2 and 8 compared with a conventional Class B amplifier.

FIG. 14 shows a graph Power Loss in the amplifiers of FIGS. 2 and 8 against Normalized Output Power and, for comparison, a graph of Power Loss in a conventional Class B amplifier against Normalized Output Power. As with FIG. 13, the graphs shown are for the amplifiers operating at maximum output power with a sinusoidal input, without clipping normalized to 1.

Although in terms of efficiency and power loss, the performance of the embodiment of FIG. 8 is not as good as that of FIG. 2, an advantage of the embodiment of FIG. 8 is that a differential amplifier having lower output voltage and also a lower output power may be used. If the maximum output voltage of the differential amplifier 23 is 12V, then the overall output voltage to the load 24 will be 60V.

The efficiency and power loss calculations for the embodiment of FIG. 8 are described as follows.

As before, a conventional Class B amplifier with a supply voltage of $V_{cc}$ and capable of delivering a maximum output voltage of amplitude $V_{cc}$ is used as comparison. The symbols used have been kept the same, except for $V_{cc1}$, which is changed to $V_{cc}/5$.

Output voltage, $V_{out}=V_0 \sin \omega t$
Average output power, $$P_{ave-out} = \frac{V_{out}^2}{2R}$$

Class µ Amplifier Stage 1: For sinusoidal output voltage $|V_0|<|V_{cc1}|$:

For this stage of operation, the ground potential will be supplied to the positive side of the load 24. Thus, only the differential amplifier 23 is supplying the signal to the load 24 at the negative side thereof.

Average input power, $P_{ave-in-1} = \dfrac{2V_{cc1}V_0}{\pi R}$ $$= \frac{2V_{cc}V_0}{5\pi R} \quad \because V_{cc1} = \frac{V_{cc}}{5}$$

Efficiency, $\varepsilon_1 = \dfrac{\pi V_0}{4V_{cc1}}$ $$= \frac{5\pi V_0}{4V_{cc}}$$

Comparing the above with a conventional Class B Amplifier, during this stage of operation, $$\frac{\varepsilon_1}{\varepsilon_B} = \frac{5\pi V_0}{4V_{cc}} \times \frac{4V_{cc}}{\pi V_0} = 5$$

$$\Rightarrow \varepsilon_1 = 5\varepsilon_B$$

Average power loss, $P_{ave-loss-1} = P_{ave-in-1} - P_{ave-out}$ $$= \frac{2V_{cc}V_0}{5\pi R} - \frac{V_0^2}{2R}$$

Class µ Amplifier Stage 2: For sinusoidal output voltage $|V_{cc1}|<|V_0|<|3V_{cc1}|$ For this stage, it is necessary to determine the time $t_1$ when $V_{out}=V_{cc1}$, which is the moment that $V_{cc1}$ is switched on.

Output voltage, $V_{out} = V_0 \sin \omega t$

At $t_1$, $V_{out} = V_{cc1}$, $\Rightarrow V_{cc1} = V_0 \sin \dfrac{2\pi}{T} t_1$ $$\frac{2\pi}{T} t_1 = \sin^{-1} \frac{V_{cc1}}{V_0}$$

$$t_1 = \frac{T}{2\pi} \sin^{-1} \frac{V_{cc}}{5V_0} \qquad (3)$$

For the positive side of the load 24, the total input power for ¼ period is:

$$P_{total-in-2+} = \int_{t_1}^{\frac{T}{4}} \frac{2V_{cc1}V_0 \sin \omega t}{R} dt$$

$$= \frac{2V_{cc1}V_0}{R} \int_{t_1}^{\frac{T}{4}} \sin \frac{2\pi}{T} t \, dt$$

$$= \frac{2V_{cc}V_0}{5R} \frac{T}{2\pi} \left[-\cos \frac{2\pi}{T} t\right]_{t_1}^{\frac{T}{4}}$$

$$= \frac{V_{cc}V_0 T}{5\pi R} \cos \frac{2\pi}{T} t_1$$

For the negative side of the load 24, the total input power for ¼ period is:

$$P_{total-in-2-} = \int_0^{\frac{T}{4}} \frac{V_{cc1}V_0 \sin\omega t}{R} dt \quad (4)$$

$$= \frac{V_{cc1}V_0}{R} \int_0^{\frac{T}{4}} \sin\frac{2\pi}{T} t \, dt$$

$$= \frac{V_{cc}V_0}{5R} \frac{T}{2\pi}\left[-\cos\frac{2\pi}{T}t\right]_0^{\frac{T}{4}}$$

$$= \frac{V_{cc}V_0 T}{10\pi R}$$

Average input power, $P_{ave-in-2} = \dfrac{P_{total-in-2+} + P_{total-in-2+}}{\frac{T}{4}}$ $$= \frac{2V_{cc}V_0}{5\pi R}\left(1 + 2\cos\frac{2\pi}{T}t_1\right)$$

Efficiency, $\varepsilon_2 = \dfrac{V_0^2}{2R} \times \dfrac{5\pi R}{2V_{cc}V_0\left(1 + 2\cos\frac{2\pi}{T}t_1\right)}$ $$= \frac{5\pi V_0}{4V_{cc}\left(1 + 2\cos\frac{2\pi}{T}t_1\right)}$$

Comparing the above with a conventional Class B Amplifier, $$\frac{\varepsilon_2}{\varepsilon_B} = \frac{5\pi V_0}{4V_{cc}\left(1 + 2\cos\frac{2\pi}{T}t_1\right)} \times \frac{4V_{cc}}{\pi V_0}$$

$$\frac{\varepsilon_2}{\varepsilon_B} = \frac{5}{\left(1 + 2\cos\frac{2\pi}{T}t_1\right)}$$

Average power loss, $P_{ave-loss-2} = P_{ave-in-2} - P_{ave-out}$ $$= \frac{2V_{cc}V_0}{5\pi R}\left(1 + 2\cos\frac{2\pi}{T}t_1\right) - \frac{V_0^2}{2R}$$

Class μ Amplifier Stage 3: For sinusoidal output voltage $|3V_{cc1}|<|V_0|V_{cc1}|$ From (3), $t_1 = \dfrac{T}{2\pi}\sin^{-1}\dfrac{V_{cc}}{5V_0}$ The time $t_2$, when $V_{out}=V_{cc2}$, the moment that $3V_{cc1}$ is switched on, is given as follows.

$$V_{out} = V_0 \sin\omega t$$

$$\Rightarrow 3V_{cc1} = V_0 \sin\frac{2\pi}{T}t_2$$

$$\frac{2\pi}{T}t_2 = \sin^{-1}\frac{3V_{cc1}}{V_0}$$

$$t_2 = \frac{T}{2\pi}\sin^{-1}\frac{3V_{cc}}{5V_0}$$

For the positive side of the load 24, the total input power for ¼ period is:

$$P_{total-in-3+} = \int_{t_1}^{t_2} \frac{2V_{cc1}V_0\sin\omega t}{R} dt + \int_{t_2}^{\frac{T}{4}} \frac{4V_{cc1}V_0\sin\omega t}{R} dt$$

$$= \frac{2V_{cc1}V_0}{R}\int_{t_1}^{t_2}\sin\frac{2\pi}{T}t\,dt + \frac{4V_{cc1}V_0}{R}\int_{t_2}^{\frac{T}{4}}\sin\frac{2\pi}{T}t\,dt$$

$$= \frac{2V_{cc1}V_0}{R}\frac{T}{2\pi}\left[-\cos\frac{2\pi}{T}t\right]_{t_1}^{t_2} + \frac{4V_{cc1}V_0}{R}\frac{T}{2\pi}\left[-\cos\frac{2\pi}{T}t\right]_{t_2}^{\frac{T}{4}}$$

$$= \frac{V_{cc1}V_0 T}{\pi R}\left\{\cos\frac{2\pi}{T}t_1 - \cos\frac{2\pi}{T}t_2\right\} + \frac{2V_{cc1}V_0 T}{\pi R}\left(\cos\frac{2\pi}{T}t_2\right)$$

But $\because V_{cc1} = \dfrac{V_{cc}}{5}$, $$\therefore P_{total-in-3+} = \frac{V_{cc}V_0 T}{25\pi R}\left(\cos\frac{2\pi}{T}t_1 + \cos\frac{2\pi}{T}t_2\right)$$

For the negative side of the load 24, from equation (4), $$P_{total-in-3-} = \frac{V_{cc}V_0 T}{10\pi R}$$

Average total input power, $P_{total-in-3} = \dfrac{P_{total-in-3+} + P_{total-in-3-}}{\frac{T}{4}}$ $$= \frac{4}{T}\left\{\frac{V_0 V_{cc} T}{5\pi R}\left(\cos\frac{2\pi}{T}t_1 + \cos\frac{2\pi}{T}t_2\right) + \frac{V_{cc}V_0 T}{10\pi R}\right\}$$

$$= \frac{2V_0 V_{cc}}{5\pi R}\left(1 + 2\cos\frac{2\pi}{T}t_1 + 2\cos\frac{2\pi}{T}t_2\right)$$

Efficiency, $\varepsilon_3 = \dfrac{V_0^2}{2R} \times \dfrac{5\pi R}{2V_{cc}V_0\left(1 + 2\cos\frac{2\pi}{T}t_1 + 2\cos\frac{2\pi}{T}t_2\right)}$ $$= \frac{5\pi V_0}{4V_{cc}\left(1 + 2\cos\frac{2\pi}{T}t_1 + 2\cos\frac{2\pi}{T}t_2\right)}$$

Comparing the above with a conventional Class B Amplifier, $$\frac{\varepsilon_3}{\varepsilon_B} = \frac{5\pi V_0}{4V_{cc}\left(1 + 2\cos\frac{2\pi}{T}t_1 + 2\cos\frac{2\pi}{T}t_2\right)} \times \frac{4V_{cc}}{\pi V_0}$$

$$\frac{\varepsilon_2}{\varepsilon_B} = \frac{5}{\left(1 + 2\cos\frac{2\pi}{T}t_1 + 2\cos\frac{2\pi}{T}t_2\right)}$$

Average power loss, $P_{ave-loss-3} = P_{ave-in-3} - P_{ave-out}$ $$= \frac{2V_{cc}V_0}{5\pi R}\left(1 + 2\cos\frac{2\pi}{T}t_1 + 2\cos\frac{2\pi}{T}t_2\right) - \frac{V_0^2}{2R}$$

As mentioned above, it is proposed that amplifiers embodying the present invention are to be named the Class μ Amplifier because of the resultant shape of the curve when the graph of Efficiency against Output Power is plotted (as shown in FIG. 6). From the graph of FIG. 6, it will be seen that for a Class µ amplifier implementing 3 stages of operation, during a proposed typical operation at ⅛ to ⅓ of the maximum output power, an efficiency of about 62% to 75% may be achieved. This is typically 1.5 times more efficient than conventional Class B amplifiers.

The difference in the actual power loss between the Class µ amplifier and the conventional Class B amplifier is evident from the graph of Power Loss against Output Power shown in FIG. 7. During an operation at ⅛ to ⅓ of maximum output power, the power loss of the Class µ amplifier may be seen to be less than ⅓ of that of a conventional Class B Amplifier. For the whole range of output power, the maximum power loss of the Class µ Amplifier may be seen to be less than half of that of a conventional Class B Amplifier.

If more stages of operation are used for the Class µ amplifier, higher efficiencies may be achieved.

In summary, one or more preferred embodiments of the invention may provide an amplifier circuit that achieves considerably greater efficiency than a conventional Class B amplifier. Another advantage of one or more preferred embodiments of the invention is that errors generated in the switching circuit may be substantially eliminated as the differential amplifier will apply the errors to the opposite side of the load 24, thereby canceling them out.

The invention claimed is:

1. An amplifier system comprising:
    an amplifier;
    a comparator connectable to said amplifier to compare an incoming signal with a number of reference potentials, said comparator having an output;
    a switching stage controllable by said output of said comparator to select a voltage level to be applied to one side of a load;
    a subtractor for subtracting from said incoming signal a percentage of said selected voltage level to be applied to said load to provide an output signal of said subtractor;
    said amplifier being arranged to receive said output signal of said subtractor and to amplify said output signal to be applied to a second side of said load.

2. An amplifier system according to claim 1, wherein said amplifier and subtractor comprise a differential amplifier.

3. An amplifier system according to claim 1, wherein said amplifier includes said subtractor.

4. An amplifier system according to claim 1, wherein said amplifier is a linear amplifier.

5. An amplifier system according to claim 1, wherein said amplifier has a gain associated therewith, and wherein said percentage of said selected voltage subtracted by said subtractor is inversely proportional to said gain of said amplifier.

6. An amplifier system according to claim 1, wherein said incoming signal varies between a first potential and a second potential, said reference potentials being obtainable from one or more supplies having a range of or between said first and second potentials of said input signal.

7. An amplifier system according to claim 1, wherein said load comprises a loudspeaker system.

8. An audio system comprising the amplifier system of claim 1.

9. A method for amplifying a signal in an amplifier system comprising:
    comparing in a comparator an incoming signal with a number of reference potentials, said comparator having an output;
    selecting in a switching stage a voltage level to be applied to one side of a load, said switching stage being controllable by said output of said comparator;
    subtracting from said incoming signal a percentage of said selected voltage level to be applied to said load to provide an output signal of a subtractor;
    receiving in an amplifier said output signal of said subtractor;
    amplifying said output signal of said subtractor; and
    applying said amplified signal to a second side of said load.

10. A method according to claim 9, wherein the step of amplifying said signal comprises amplifying said signal using a differential amplifier.

11. A method according to claim 9, wherein the step of amplifying said signal comprises amplifying said signal using a linear amplifier.

12. A method according to claim 9, wherein said amplifier has a gain associated therewith, and wherein said step of subtracting the percentage of said selected voltage comprises subtracting a percentage which is inversely proportional to said gain of said amplifier.

13. A method according to claim 9, wherein said incoming signal varies between a first potential and a second potential, the method further comprising obtaining said reference potentials from one or more supplies having a range of or between said first and second potentials of said input signal.

* * * * *